United States Patent
Nogami et al.

(10) Patent No.: US 6,878,632 B2
(45) Date of Patent: Apr. 12, 2005

(54) SEMICONDUCTOR DEVICE HAVING A CONDUCTIVE LAYER WITH A COBALT TUNGSTEN PHOSPHORUS COATING AND A MANUFACTURING METHOD THEREOF

(75) Inventors: Takeshi Nogami, Kanagawa (JP); Naoki Komai, Kanagawa (JP); Hideyuki Kito, Kanagawa (JP); Mitsuru Taguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 222 days.

(21) Appl. No.: 10/149,481

(22) PCT Filed: Oct. 12, 2001

(86) PCT No.: PCT/JP01/08989
§ 371 (c)(1),
(2), (4) Date: Oct. 7, 2002

(87) PCT Pub. No.: WO02/31876
PCT Pub. Date: Apr. 18, 2002

(65) Prior Publication Data
US 2003/0119317 A1 Jun. 26, 2003

(30) Foreign Application Priority Data
Oct. 12, 2000 (JP) .................................. 2000-311465

(51) Int. Cl.[7] .......................................... H01L 21/311
(52) U.S. Cl. ........................ 438/694; 438/720; 257/508
(58) Field of Search ................... 438/706, 710, 438/719, 720, 723, 694; 257/506, 508

(56) References Cited

U.S. PATENT DOCUMENTS

| | | | | | |
|---|---|---|---|---|---|
| 5,695,810 | A | * | 12/1997 | Dubin et al. ................. | 427/96 |
| 6,100,184 | A | * | 8/2000 | Zhao et al. ................. | 438/638 |
| 6,645,550 | B1 | * | 11/2003 | Cheung et al. ............. | 427/123 |
| 6,709,874 | B1 | * | 3/2004 | Ning ............................. | 438/3 |

FOREIGN PATENT DOCUMENTS

| | | |
|---|---|---|
| JP | 8330314 | 12/1996 |
| JP | 9064034 | 3/1997 |
| JP | 323479 | 11/2000 |
| JP | 230220 | 8/2001 |
| JP | 284453 | 10/2001 |
| JP | 316834 | 11/2001 |

OTHER PUBLICATIONS

S. Lopatin et al., Integration of Electroless Cu and CoWP Multilyaers in Damascene Process, *Cornell University*, vol. 97–8, pp. 186–195.

* cited by examiner

*Primary Examiner*—Kin-Chan Chen
(74) *Attorney, Agent, or Firm*—Sonnenschein, Nath & Rosenthal LLP

(57) ABSTRACT

A semiconductor device capable of suppressing diffusion of copper at an interface between a copper wire and a cap film to enhance an electromigration resistance to ensure reliability of the copper wire, and a manufacturing method thereof are provided. The semiconductor device according to the present invention comprises an insulating film (12) formed on a substrate (11), a concave portion (13) (for example, a groove) formed in the insulating film, a conductive layer (15) embedded in the concave portion through a barrier layer (14), and a cobalt tungsten phosphorus coating (16) to connect with the barrier layer on the side of the conductive layer and to coat the conductive layer on the opening side of the concave portion.

5 Claims, 2 Drawing Sheets

11: SUBSTRATE
12: INSULATING FILM
13: CONCAVE PORTION (GROOVE)
14: BARRIER LAYER
15: CONDUCTIVE LAYER
16: COBALT TUNGSTEN PHOSPHORUS COATING

SEMICONDUCTOR DEVICE HAVING A CONDUCTIVE LAYER WITH A COBALT TUNGSTEN PHOSPHORUS COATING AND A MANUFACTURING METHOD THEREOF

TECHNICAL FIELD

The present invention relates to a semiconductor device and a manufacturing method thereof, and particularly, to a semiconductor device having a conductive layer on which a cobalt tungsten phosphorus coating is formed to serve as a cap on the conductive layer, and a manufacturing method thereof.

BACKGROUND OF THE INVENTION

Copper wires are of increasing importance in fine elements in which delays in circuits due to parasitic resistance and parasitic capacitance of wires are dominant since the copper wires can achieve a lower resistance, a lower capacitance, and higher reliability than those of aluminum wires. As a typical method of forming copper wires, damascene processes are widely accepted. Of the damascene processes, a dual damascene process is accepted in view of manufacturing cost. With the employment of this dual damascene process, it has been expected that a copper wire process would accomplish a lower cost than that of a conventional aluminum wire process.

However, since copper is prone to oxidization as compared with aluminum, it has been necessary to use silicon nitride (SiN) with a high relative dielectric constant of 8 as a cap film to prevent oxidization of the surface of the copper. As a result, a detriment of increasing parasitic capacitance in the overall wire system occurs. In addition, since the surface of the copper is chemically unstable although the copper has properties which raise expectation of a high electromigration resistance, an interface between the copper and the silicon nitride acts as a path on which the copper is preferentially diffused to cause a problem of failing to obtain the expected high electromigration resistance (reliability).

SUMMARY OF THE INVENTION

The present invention has been made to solve the aforementioned problems and provides a semiconductor device and a manufacturing method thereof.

The semiconductor device according to the present invention comprises an insulating film formed on a substrate, a concave portion formed in the insulating film, a conductive layer embedded in the concave portion through a barrier layer, and a cobalt tungsten phosphorus (CoWP) coating to connect with the barrier layer on the side of the conductive layer and to coat the conductive layer on the opening side of the concave portion.

In the aforementioned semiconductor device, since the cobalt tungsten phosphorus coating is formed to connect with the barrier layer on the side of the conductive layer and to coat the conductive layer on the opening side of the concave portion, a cap layer on the conductive layer is formed of a material having conductivity. Also, since the cobalt tungsten phosphorus coating is unlikely to serve as a path on which copper is preferentially diffused at an interface with the copper, a high electromigration resistance (reliability) can be obtained.

In addition, since the conductive layer is in a state in which it is surrounded by the barrier layer and the cobalt tungsten phosphorus coating, the conductive layer is completely coated with and protected by the barrier layer and the cobalt tungsten phosphorus coating even when the conductive layer is formed of a material prone to oxidization such as copper. Furthermore, since the cobalt tungsten phosphorus coating is in close contact with the conductive layer on the top surface and the side surface closer to the top of the conductive layer, the cobalt tungsten phosphorus coating is unlikely to come off. Consequently, the strength of the connection of the cobalt tungsten phosphorus coating with the barrier layer is increased, so that the cobalt tungsten phosphorus coating and the barrier layer prevent diffusion of copper even with the conductive layer made of copper and prevent diffusion of oxygen to the conductive layer so as to prevent oxidization of the conductive layer.

The method of manufacturing a semiconductor device according to the present invention comprises the steps of forming a concave portion in an insulating film formed on a substrate, forming a barrier layer on an inner surface of the concave portion and on a surface of the insulating film and forming a conductive layer on the surface of the insulating film to be embedded in the concave portion through the barrier layer, removing the conductive layer such that the conductive layer is left in the concave portion and removing the barrier layer on the surface of the insulating film such that the top end of the barrier layer left in the concave portion is positioned between a side surface of the conductive layer and a side wall of the concave portion, and forming a cobalt tungsten phosphorus coating to connect with the barrier layer on a side of the conductive layer and to selectively cover the conductive layer on an opening side of the concave portion with electroless plating.

In the aforementioned method of manufacturing a semiconductor device, since the barrier layer on the surface of the insulating film is removed such that the top end of the barrier layer left in the concave portion is positioned between the side surface of the conductive layer and the side wall of the concave portion, and the cobalt tungsten phosphorus coating is then formed to connect with the barrier layer on the side of the conductive layer and to selectively cover the conductive layer on the opening side of the concave portion, the cobalt tungsten phosphorus coating is formed to connect to the barrier layer on the side of the conductive layer and to selectively cover the conductive layer on the opening side of the concave portion. Also, since the cobalt tungsten phosphorus coating is unlikely to serve as a path on which copper is preferentially diffused at an interface with the copper, a high electromigration resistance (reliability) can be obtained.

In addition, to remove the barrier layer on the surface of the insulating film such that the top end of the barrier layer left in the concave portion is positioned between the side surface of the conductive layer and the side wall of the concave portion, a typical method of removing the barrier layer can be used. Specifically, at the typical step of removing the barrier layer formed on the surface of the insulating film, over-etching is performed to completely remove the barrier layer on the surface of the insulating film. Thus, the barrier layer formed on the side wall of the concave portion is removed such that the top end thereof is closer to the bottom of the concave portion than to the surface of the conductive layer. With this, when the cobalt tungsten phosphorus coating is formed, it is formed to connect with the barrier layer on the side of the conductive layer. Since the cobalt tungsten phosphorus coating connects with the barrier layer on the side of the conductive layer in this manner, the conductive layer is in a state in which it is surrounded by the barrier layer and the cobalt tungsten phosphorus coating.

Furthermore, since the connecting portion is located on the side of the conductive layer, the cobalt tungsten phosphorus coating is closely contact with the conductive layer on the top surface and the side surface closer to the top of the conductive layer, the cobalt tungsten phosphorus coating is unlikely to come off. Consequently, the strength of the connection of the cobalt tungsten phosphorus coating with the barrier layer is increased, so that the cobalt tungsten phosphorus coating and the barrier layer prevent diffusion of copper even with the conductive layer made of copper and prevent diffusion of oxygen to the conductive layer so as to prevent oxidization of the conductive layer.

DETAILED DESCRIPTION OF THE PREFERRED EMBODIMENTS

An embodiment according to a semiconductor device of the present invention will be described with a schematic sectional view of a configuration of FIG. 1.

Figure 1:
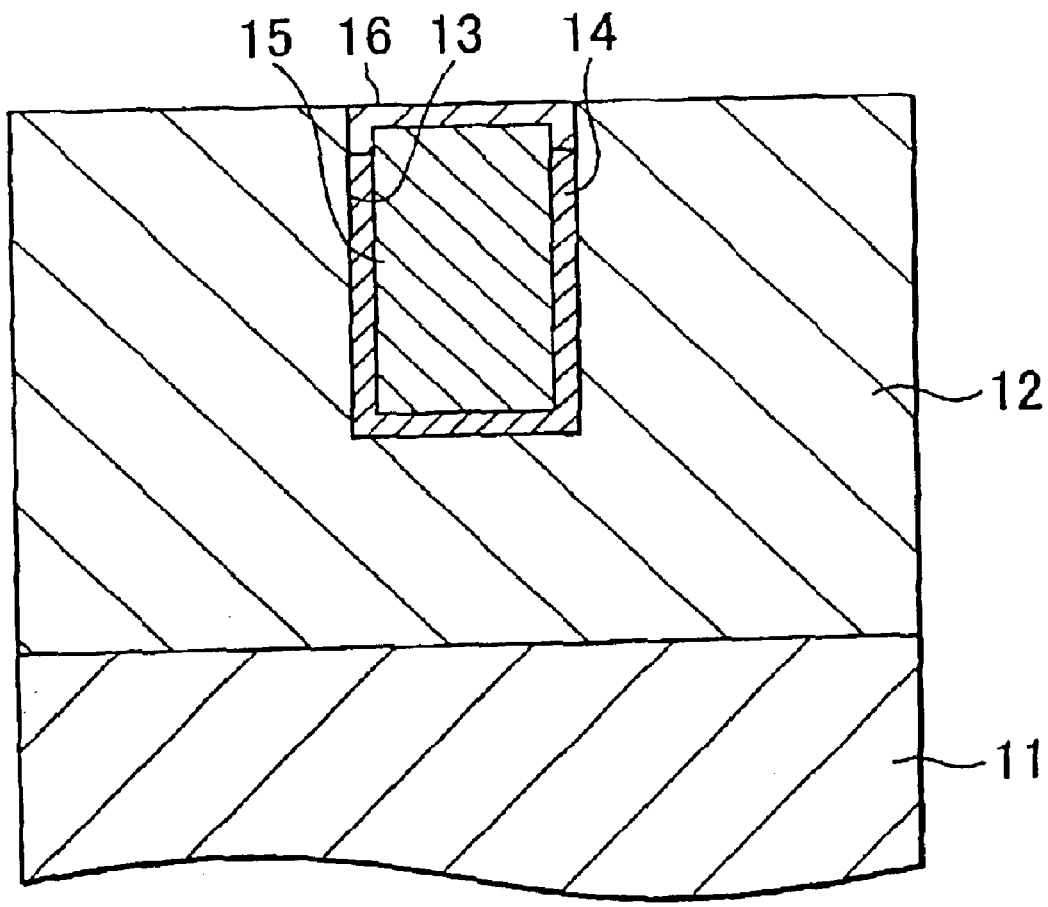
FIG. 1 is a schematic sectional view of a configuration showing an embodiment according to a semiconductor device of the present invention.

As shown in FIG. 1, an insulating film 12 is formed of, for example, a silicon oxide film, on a substrate 11. It should be noted that an organic insulating film, a porous insulating film or the like can be used as the insulating film 12. A concave portion 13 formed of, for example, a groove in which a groove wire is to be formed, is formed in the aforementioned insulating film 12. A conductive layer 15 is embedded in the concave portion 13 on inner walls thereof through a barrier layer 14, bay way of example. The barrier layer 14 is formed of, for example tungsten nitride, and the conductive layer 15 is formed of, for example copper or an alloy of copper. A cobalt tungsten phosphorus (COWP) coating 16 is formed to connect with the top end of the barrier layer 14 on a side of the conductive layer 15 and to selectively coat the conductive layer 15 on an opening side of the concave portion 13. In other words, the cobalt tungsten phosphorus coating 16 connects with the barrier layer 14 on the side of the conductive layer 15, and the cobalt tungsten phosphorus coating 16 and the barrier layer 14 surround the conductive layer 15.

While the concave portion 13 is formed of the groove in the aforementioned description, the concave portion 13 may be a connecting hole in which a plug for connecting one wire to another wire is to be formed, or a groove in which a wire is to be formed and a connecting hole formed on the bottom of this groove.

Since the cobalt tungsten phosphorus coating 16 is formed to connect with the barrier layer 14 on the side of the conductive layer 15 and to coat the conductive layer 15 on the opening side of the concave portion 13 in the aforementioned semiconductor device, a cap layer on the conductive layer 15 is made of cobalt tungsten phosphorus having conductivity. In addition, since the cobalt tungsten phosphorus coating 16 is unlikely to serve as a path on which copper is preferentially diffused at an interface with the copper, a high electromigration resistance (reliability) can be obtained.

In addition, since the conductive layer 15 is in a state in which it is surrounded by the barrier layer 14 and the cobalt tungsten phosphorus coating 16, the conductive layer 15 is completely coated with and protected by the barrier layer 14 and the cobalt tungsten phosphorus coating 16 even when the conductive layer 15 is made of a material prone to oxidization such as copper. Furthermore, since the cobalt tungsten phosphorus coating 16 is in close contact with the conductive layer 15 on the top surface and the side surface closer to the top of the conductive layer 15, the cobalt tungsten phosphorus coating 16 is unlikely to come off.

Consequently, the strength of the connection of the cobalt tungsten phosphorus coating 16 with the barrier layer 16 is increased, so that the cobalt tungsten phosphorus coating 16 and the barrier layer 14 prevent diffusion of copper even with the conductive layer 15 made of copper and prevent diffusion of oxygen to the conductive layer 15 so as to prevent oxidization of the conductive layer 15.

Next, an embodiment according to a method of manufacturing a semiconductor device of the present invention will be described with sectional views of manufacturing steps of FIGS. 2A to 2F. Parts similar to those shown in FIG. 1 mentioned above are designated with the same reference numerals in FIGS. 2A to 2F.

Figure 2A:
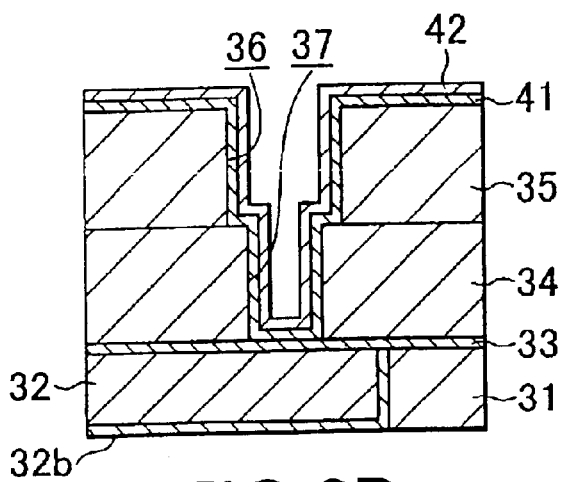
FIGS. 2A to 2F are sectional views of manufacturing steps showing an embodiment according to a method of manufacturing a semiconductor device of the present invention.

As shown in FIG. 2A, a first wire 32, for example of a groove wire configuration, is formed through a barrier layer 32b in a first insulating film 31 formed on a substrate (not shown). A diffusion preventing layer 33 for covering the first wire 32 is formed on the first insulating film 31, and a second insulating film 34 is formed thereon. The diffusion preventing layer 33 may have a function as an etching stopper at the time of formation of a connecting hole. In addition, a third insulating film 35 is formed on the second insulating film 34. A concave portion 36 (hereinafter described as a groove 36) is formed in the third insulating film 35, and a connecting hole 37 is formed to extend from the bottom of the groove 36, to pass through the second insulating film 34, and to reach the first wire 32.

A barrier layer 41 is formed on inner surfaces of the wire groove 36 and the connecting hole 37 as configured above. The barrier layer 41 is formed of, for example, tungsten nitride. In addition, a copper seed layer 42 is formed on the surface of the barrier layer 41 using a deposition technique such as sputtering. Typically, for a groove, a connecting hole with a high aspect ratio, seed layer reinforcing electrolytic plating is performed to supplement an insufficient thickness of a copper seed layer on a side wall of the groove, a side wall of the connecting hole. In the figures, the copper seed layer 42 for which the seed layer reinforcing electrolytic plating has been performed is shown. Then, the substrate is cleaned. This cleaning is performed, for example, through washing.

Figure 2D:
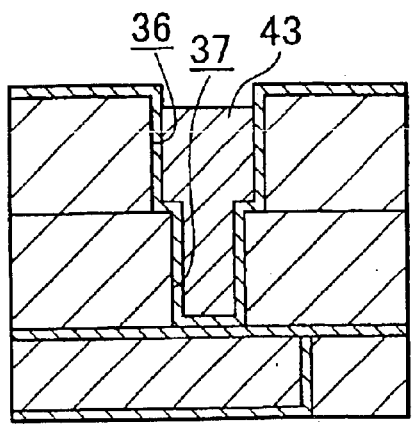
Figure 2B:
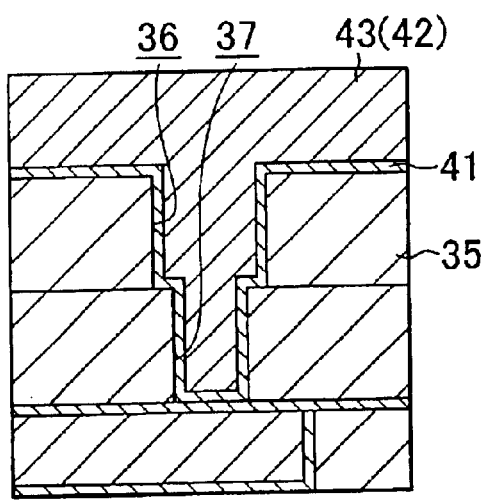

Next, as shown in FIG. 2B, a conductive layer 43 made of copper is embedded in the groove 36 and the connecting hole 37 by performing copper electrolytic plating. In this event, the conductive layer 43 made of copper is also deposited on the barrier layer 41 on the third insulating film 35. It should be noted that the copper seed layer 42 is shown as included in the conductive layer 43 in the figure. In the sequence of the electrolytic plating process, plating conditions are selected to planarize the surface of the conductive layer 43 after the plating to form a copper plating layer having a flat surface. Then, the substrate is cleaned. This cleaning is performed, for example, through washing.

Figure 2E:
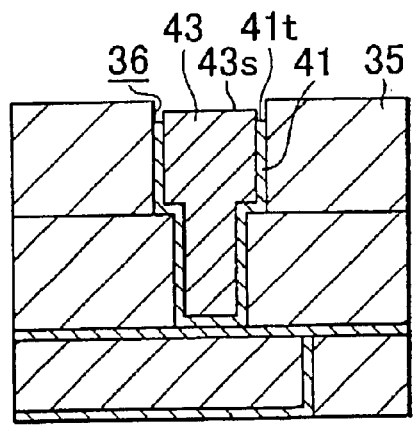
Figure 2C:
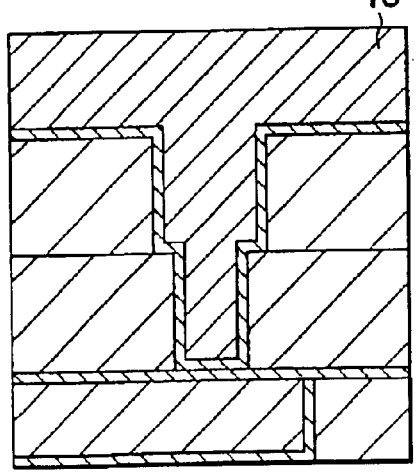

Next, as shown in FIG. 2C, the substrate subjected to the aforementioned processing is annealed. This annealing promotes growth of copper crystal grains in the conductive layer 43 having fine crystal grains after the electrolytic plating.

Next, as shown in FIG. 2D, electrolytic polishing is performed to remove the conductive layer 43 on the surface of the insulating film (third insulating film 35), leaving the conductive layer 43 only inside the groove 36 and the connecting hole 37.

Subsequently, as shown in FIG. 2E, the barrier layer 41 made of tungsten nitride is removed by wet etching with hydrogen peroxide. Specifically, an aqueous solution of the hydrogen peroxide is sprayed onto the surface of the substrate to dissolve and remove an unnecessary portion of the barrier layer 41 made of tungsten nitride on the flat surface. Since the etching of the tungsten nitride progresses isotropically, over-etching is required to some extent to completely remove the tungsten nitride on the surface of the third insulating film 35. As a result, side etching occurs on the side wall of the groove 36, and a top end 41t of the barrier layer 41 is formed to be lower than a surface 43s of the conductive layer 43. Then, the substrate is cleaned. This cleaning is performed, for example, through washing.

Figure 2F:
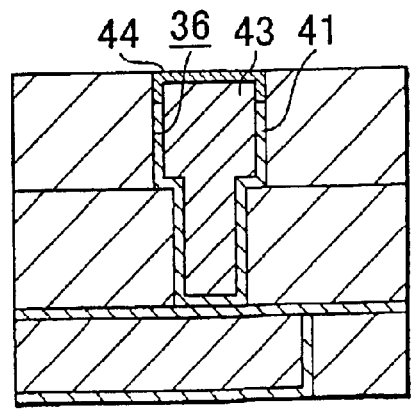

Next, as shown in FIG. 2F, with electroless plating, a cobalt tungsten phosphorus (COWP) coating 44 is selectively formed on the exposed surface of the conductive layer 43. For the selectivity of the deposition, before the COWP electroless plating is performed, the surface of the conductive layer 43 is coated with palladium by electroless displacement plating of copper. This is because, with the palladium coating, the deposition of the COWP is produced only on the palladium using the palladium as a catalyst. Once the surface of the palladium is coated with the COWP, plating growth of the COWP progresses through autocatalytic plating using the COWP itself as a catalyst with the selectivity maintained. The exposed surface of the conductive layer 43 due to the side etching produced by etching the barrier layer 41 made of tungsten nitride is coated with this cobalt tungsten phosphorus coating 44. Then, the substrate is cleaned. This cleaning is performed, for example, through washing.

Of the materials described in the aforementioned embodiment, the barrier layer 41 is not limited to the tungsten nitride, and it may be replaced with a material having similar functions, for example, tantalum nitride or the like.

While the technique for forming the cobalt tungsten phosphorus coating 44 on the conductive layer 43 formed of copper embedded in the groove 36 has been described in the aforementioned description, application can be made to a technique for forming a plug made of copper or an alloy of copper in a connecting hole and coating the top surface side of the plug with a cobalt tungsten phosphorus coating, by way of example.

In the aforementioned method of manufacturing a semiconductor device, since the barrier layer 41 on the surface of the third insulating film 35 is removed such that the top end of the barrier layer 41 left in the concave portion (groove) 36 is positioned between the side surface of the conductive layer 43 and the side wall of the groove 36, and then the cobalt tungsten phosphorus coating 44 is formed to connect with the barrier layer 41 on the side of the conductive layer 43 and to selectively coat the conductive layer 43 on the opening side of the groove 36, the cobalt tungsten phosphorus coating 44 is formed to connect with the barrier layer 41 on the side of the conductive layer 43 and to selectively coat the conductive layer 43 on the opening side of the groove 36. In addition, since the cobalt tungsten phosphorus coating 44 is unlikely to serve as a path on which the copper is preferentially diffused at the interface with the copper, a wire formed of the conductive layer 43 can achieve a high electromigration resistance (reliability).

In addition, the barrier layer 41 on the third insulating film 35 is removed with the wet etching using the hydrogen peroxide. In this event, the over-etching is typically performed to completely remove the barrier layer 41 on the surface of the third insulating film 35. Consequently, the top end of the barrier layer 41 left in the groove 36 is positioned between the side surface of the conductive layer 43 and the side wall of the groove 36. The barrier layer 41 formed on the side wall of the groove 36 is removed such that its top end is closer to the bottom of the groove 36 than to the surface of the conductive layer 43. Thus, when the cobalt tungsten phosphorus coating 44 is formed, it is formed to connect with the barrier layer 41 on the side of the conductive layer 43. In this manner, since the cobalt tungsten phosphorus coating 44 connects with the barrier layer 41 on the side of the conductive layer 43, the barrier layer 41 and the cobalt tungsten phosphorus coating 44 surround the conductive layer 43. Furthermore, since the connecting portion is located on the side of the conductive layer 43 to thereby bring the cobalt tungsten phosphorus coating 44 into close contact with the conductive layer 43 on the top surface and the side surface closer to the top of the conductive layer 43, the cobalt tungsten phosphorus coating 44 is unlikely to come off. As a result, the strength of the connection of the cobalt tungsten phosphorus coating 44 with the barrier layer 41 is increased, so that the cobalt tungsten phosphorus coating 44 and the barrier layer 41 prevent diffusion of the copper in the conductive layer 43. In addition, since diffusion of oxygen to the conductive layer 43 is prevented, oxidization of the conductive layer is prevented.

As so far described, according to the semiconductor device of the present invention, since the cobalt tungsten phosphorus coating is formed to connect with the barrier layer on the side of the conductive layer and to coat the conductive layer on the opening side of the concave portion, the interface between the cobalt tungsten phosphorus coating and the conductive layer does not serve as a diffusion path of copper even when the conductive layer is formed of copper or an alloy of copper, so that electromigration resistance can be ensured. In addition, since the conductive layer is in a state in which it is surrounded by the barrier layer and the cobalt tungsten phosphorus coating, the conductive layer can be completely coated with and protected by the barrier layer and the cobalt tungsten phosphorus coating. Furthermore, since the cobalt tungsten phosphorus coating is in close contact with the conductive layer on the top surface and the side surface closer to the top of the conductive layer, the cobalt tungsten phosphorus coating is unlikely to come off. From those facts, when the conductive layer is used as a wire or a plug, high reliability can be achieved. In addition, since a low dielectric constant insulating film can be directly formed on the cobalt tungsten phosphorus coating, wire parasitic resistance of the overall wire system is significantly reduced.

According to the method of manufacturing a semiconductor device of the present invention, since the barrier layer is removed such that the top end of the barrier layer left in the concave portion is positioned between the side surface of the conductive layer and the side wall of the concave portion, the cobalt tungsten phosphorus coating can be formed to connect with the barrier layer on the side of the conductive layer and to coat the conductive layer on the opening side of the concave portion in the subsequent process of forming the cobalt tungsten phosphorus coating. Thus, even when the conductive layer is formed of copper or an alloy of copper, since the interface between the cobalt tungsten phosphorus coating and the conductive layer does not serve as a diffusion path of copper, electromigration resistance can be ensured. In addition, the cobalt tungsten phosphorus coating can be formed in a state in which the cobalt tungsten phosphorus coating and the barrier layer surround the conductive layer, so that the conductive layer can be completely coated with and protected by the barrier layer and the cobalt tungsten phosphorus coating. Furthermore, since the cobalt tungsten phosphorus coating is formed in close contact with the conductive layer on the top surface and the side surface closer to top of the conductive layer, the cobalt tungsten phosphorus coating is unlikely to come off. From those facts, when the conductive layer is used as a wire or a plug, a wire or a plug with high reliability can be formed. In addition, since a low dielectric constant insulating film can be directly deposited on the cobalt tungsten phosphorus coating, wire parasitic resistance of the overall wire system can be significantly reduced.

What is claimed is:

1. A method of manufacturing a semiconductor device comprising the steps of:

forming a concave portion in an insulating film formed on a substrate;

forming a barrier layer on an inner surface of said concave portion and on a surface of said insulating film and forming a conductive layer on the surface of said insulating film to be embedded in said concave portion through said barrier layer;

removing said conductive layer such that said conductive layer is left in said concave portion and removing said barrier layer on a surface of said insulating film such that a top end of said barrier layer left in said concave portion is between a side of said conductive layer and a side wall of said concave portion; and forming a cobalt tungsten phosphorus coating to connect with said barrier layer on the side of said conductive layer and to selectively cover said conductive layer on an opening side of said concave portion with electroless plating.

2. The method of manufacturing a semiconductor device according to claim 1, wherein:

said barrier layer is made of tungsten nitride, and said barrier layer is removed with wet etching using hydrogen peroxide.

3. The method of manufacturing a semiconductor device according to claim 1, wherein:

said concave portion is formed into a groove in which a wire is to be formed.

4. The method of manufacturing a semiconductor device according to claim 1, wherein:

said concave portion is formed into a connecting hole in which a plug connecting one wire to another wire between layers is to be formed.

5. A semiconductor device comprising:

an insulating film formed on a substrate;

a concave portion formed in said insulating film;

a conductive layer embedded in said concave portion through a barrier layer;

a cobalt tungsten phosphorus coating to connect with said barrier layer on a side of said conductive layer and to coat said conductive layer on an opening side of said concave portion;

said barrier layer is formed on a more inner side of said concave portion than said conductive layer, and said barrier layer and said cobalt tungsten phosphorus coating surround said conductive layer.

* * * * *